United States Patent [19]

Sullivan

[11] 4,184,093

[45] Jan. 15, 1980

[54] PIEZOELECTRIC POLYMER RECTANGULAR FLEXURAL PLATE HYDROPHONE

[75] Inventor: Timothy D. Sullivan, East Haddam, Conn.

[73] Assignee: The United States of America as represented by the Secretary of the Navy, Washington, D.C.

[21] Appl. No.: 922,620

[22] Filed: Jul. 7, 1978

[51] Int. Cl.[2] .............................................. H01L 41/10

[52] U.S. Cl. .................................... 310/331; 310/337; 310/800

[58] Field of Search ............... 310/800, 330, 331, 332, 310/337; 340/10

[56] References Cited

U.S. PATENT DOCUMENTS

| | | | |
|---|---|---|---|
| 3,202,962 | 8/1965 | Elston | 310/337 X |
| 3,255,431 | 6/1966 | Howatt | 310/337 X |
| 3,663,933 | 5/1972 | Madison | 310/331 X |
| 3,763,464 | 10/1973 | Laurent | 310/331 X |
| 3,832,762 | 9/1974 | Johnston et al. | 310/337 X |
| 4,048,526 | 9/1977 | Taylor | 310/800 X |
| 4,088,915 | 5/1978 | Kodama | 310/800 X |
| 4,127,749 | 11/1978 | Atoji et al. | 310/800 X |

*Primary Examiner*—Mark O. Budd
*Attorney, Agent, or Firm*—Richard S. Sciascia; Arthur A. McGill; Prithvi C. Lall

[57] ABSTRACT

A transducer, suitable for sensing acoustic signals underwater, includes a piezoelectric polymer film. The device comprises a rectangular sandwich arrangement with a plastic frame in the center having plastic plates connected on either side and a piezoelectric polymer film on the outside of each plastic plate. The film is arranged so that the most active direction of the polymer lies in the transverse plate direction. Electric wires are connected to opposing surfaces of each piezoelectric polymer film. When the sandwich arrangement is complete an air cavity that is compliant to the stiffness of the plates is created in the center within the plastic frame.

2 Claims, 9 Drawing Figures

PIEZOELECTRIC POLYMER RECTANGULAR FLEXURAL PLATE HYDROPHONE

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

The present invention generally relates to a device for sensing acoustic signals and converting these signals to electrical signal outputs and vice versa. The invention more particularly relates to a listening device to sense acoustic signals underwater and to remain reliable and relatively unaffected by pressure and temperature changes encountered in an ocean's environment.

A variety of devices are currently used to sense underwater acoustic signals reliably under varying temperature and pressure conditions. Transduction mechanisms range from moving coil devices magnetostrictive and piezoelectric materials. The largest class of devices employs piezoelectric ceramic which has the disadvantages of being dense, fragile and expensive. A flexural disc device using a piezoelectric polymer film, polyvinylidene fluoride was developed by Powers and Sullivan at Naval Underwater Systems Center, New London, Connecticut. Polyvinylidene fluoride is a light, rugged and potentially inexpensive material. The above flexural disc device performs competitively with ceramic hydrophones for several applications. However, the flexural disc design often requires layers of piezoelectric polymer film to reach the desired sensitivity and capacitance and is particularly difficult to adapt to small diameter line arrays and spacial noise averaging.

SUMMARY OF THE INVENTION

It is, therefore, a general object of the present invention to provide an improved transducer. A feature is that the transducer be suitable for use in an underwater environment. Another object is that the device be of a shape suited to narrow line arrays and hull mounted arrays. These and other objects of the invention and the various features and details of construction will become apparent from the specification and drawings.

This is accomplished in accordance with the present invention by providing a hydrophone utilizing a piezoelectric polymer rectangular plate. The device is actually two transducers in one unit with active elements being placed on the top and bottom of the unit. The most active direction of the polymer lies in the transverse plate direction. Surface strains on the rectangular plates provide a stress in the polymer thereby producing a voltage across the polymer electrodes. The rectangular geometry of the device produces a higher sensitivity than was available with a circular configuration.

DESCRIPTION OF THE PREFERRED EMBODIMENTS

Figure 1:
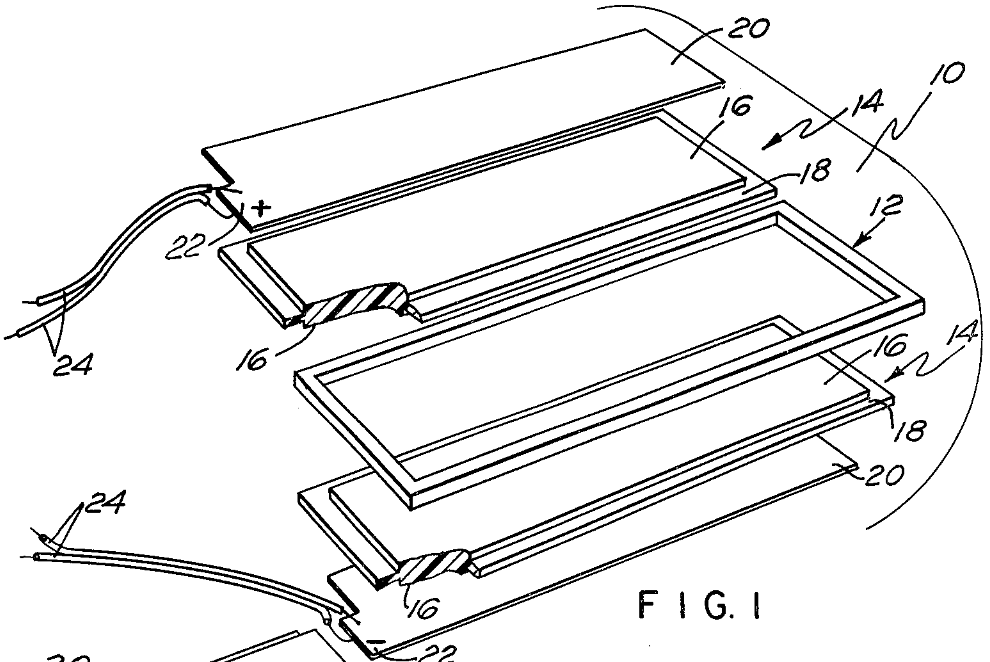
FIG. 1 is an exploded view of a piezoelectric polymer rectangular flexural plate transducer in accordance with the present invention.

Referring now to FIG. 1 there is shown an exploded view of a flexural plate transducer 10. A plastic frame 12 forms the central portion and has plastic plates 14 affixed to the top and bottom of frame 12. Plates 14 comprise a raised surface 16 on each side of the plate 14 and thin rim 18. Pieces of piezoelectric polymer film 20 such as polyvinylidene fluoride, $PVF_2$, are affixed to the outer raised surfaces 16 of plastic plates 14. Each piece of polymer film 20 has an aluminum electroded rectangular tape 22 to which electrical leads 24 are attached to the top and bottom surfaces of the respective tab 22.

Figure 2:
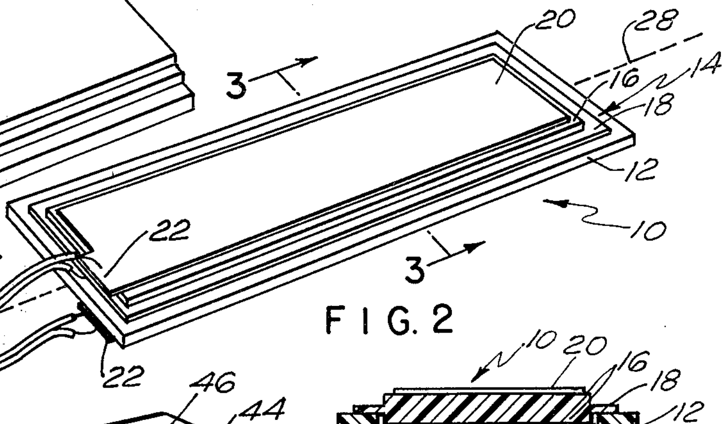
FIG. 2 is a perspective view of the assembled transducer of FIG. 1.
Figure 3:
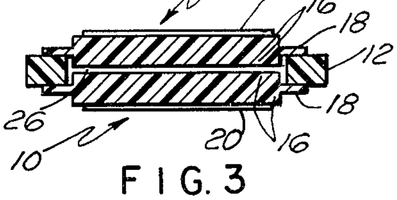
FIG. 3 is a sectional view along line 3—3 of FIG. 2.

FIG. 2 shows the assembled unit. FIG. 3 is a view along line 3—3 of FIG. 2. It is to be noted that when assembled the rims 18 of plates 14 are affixed to plastic frame 12 and the central raised portion 16 of plates 14 extend into the airgap 26 within frame 12, the rims 18 act as hinges during operation. The normal flexing takes place on both sides of axis 28 in FIG. 2.

Figure 4:
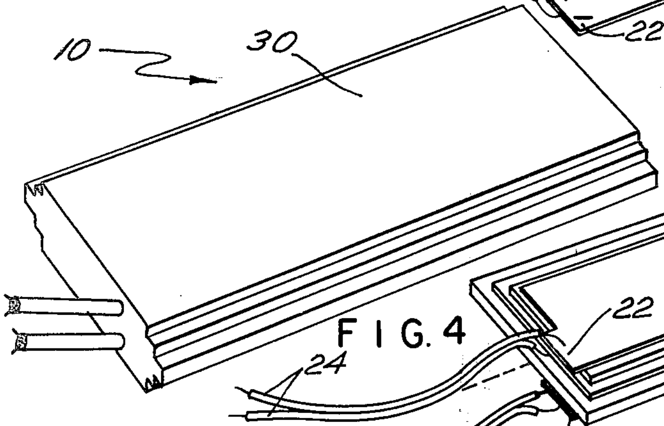
FIG. 4 is a perspective view of the transducer of FIG. 2 with a waterproof covering added.

The assembly of transducer 10 will next be described. The binding materials used are not shown in the drawings. First the rectangular pieces of piezoelectric polymer 20 are glued to the outer raised surface 16 of each plate 14 with a fast curing epoxy, being careful that the negative side of the polarized polymer 20 is glued facing the plate 14 and that the most active direction of the polymer lies in the transverse plate direction, that is, in the horizontal plane at a 90° angle with axis 28. The small rectangular tab 22 at the end of each piece of polymer 22 is left extending beyond the edge of the raised surface 16 of plate 14. Each tab 22 is kept free of glue on both sides. Next, one of each of the two lengths of dual insulated leads 24 is glued along the edge of the raised portion 16 of each plate 14, as shown in FIG. 2, so that the leads 24 can make contact to the electroded surfaces of rectangular tabs 22. Conductive epoxy is applied between the bare conductors of leads 24 and the aluminum electrode surface of the tab 22 to form electrical contacts. The dual insulated leads 24 have single conductors respectively affixed to the top and bottom surfaces of tabs 22. Highly conductive silver paint is applied over the cured conductive epoxy from the conductors of leads 24 to the aluminum electroded tabs 22 to insure good electrical contact. When the paint is dry the whole tab 22 area, where the electrical connection is located, is completely sealed in fast curing epoxy for strength. Both finished plate assemblies, that include plate 14, polymer 20 and leads 24, are then cemented at the rim 18 to the frame 12 so as to insure an airtight seal around the air cavity 26 left inside. The transducer 10 is now suitable for use in an environment such as air or oil. If the transducer is to be directly exposed to water a coating of waterproofing such as polyurethane 30 is necessary to avoid short circuiting of the electrical output through the water. This is shown as the transducer 10*a* in FIG. 4.

In operation the conversion of an acoustic signal to an electric signal is accomplished by means of the piezoelectric polymer film, polyvinylidene fluoride 20, which produces a voltage across its electrodes in response to mechanical stresses. In this transducer 10, the stresses in the polymer 20 are provided by the surface strains on the rectangular plate 14 during flexure caused by incident acoustic pressure. The rectangular plates 14 are separated from each other by the frame 12, thus leaving an air filled cavity 26 that is very compliant compared to the stiffness of the plates 14. Plate separation allows the plates to deflect and the compliance of the cavity 26 allows the magnitude of the deflection to depend almost completely on the material properties and edge conditions of the plates 14. The principal stresses in the plates 14 are oriented along the transverse and longitudinal directions, and are denoted by $T_w$ and $T_l$ respectively. The greater the length-to-width ratio of the plates 14, the greater will be the ratio $T_w$ to $T_l$, until $T_w=3.33\ T_l$. This can be closely approximated by a plate length-to-width ratio of 5 to 1. Since the most active version of piezoelectric $PVF_2$ thus far used has a much greater response in one direction than in the other, a highly uniaxial plate stress distribution will couple a greater portion of the available strain energy of the plate into the more responsive direction of the polymer, thus more effectively utilizing the polymer's piezoelectric response. This contrasts to the flexural disc where stress magnitude is independent of angle. A supported edge condition for the plate 14 is best for this transducer because then $T_w$ is uniformly high from one side to the other. This contrasts to radially decreasing stress levels in the flexural disc. Therefore, thin flanges, forming the rim 18, which are flexible in comparison to raised surface 16 of plate 14, are machined around the perimeter of each plate 14. The plates 14 are then cemented firmly to the frame 12 at the outer perimeter of the rim 18 allowing the plates 14 freedom to flex while still having a watertight connection to the frame 12. The thickness of frame 12 may be adjusted so plates 14 will touch before reaching their elastic limits. This allows the transducer 10 when functioning as a hydrophone to survive hydrostatic pressures beyond those of their normal operating range. Finally, any excitation of the fundamental plate 14 resonances will have small effect on the electrical signal because of the low coupling of strain energy and low piezoelectric response in that direction.

Figure 5:
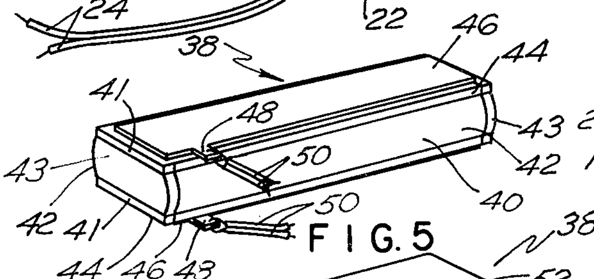
FIG. 5 is a perspective view of an alternate embodiment of a piezoelectric polymer rectangular flexural plate transducer.
Figure 6:
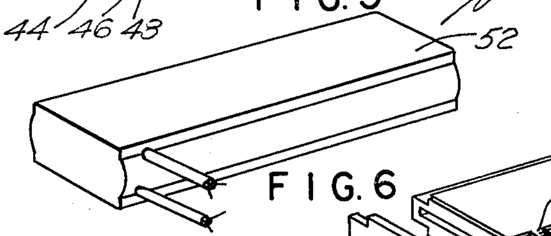
FIG. 6 is a perspective view of the transducer of FIG. 5 with a waterproof covering added.

FIG. 5 shows a transducer 38 comprised of a section of metal tubing 40 having a flat top and bottom surfaces 41 and convex sidewalls 42. The metal used was that of high strength steel. Long sections of tubing of this shape are formed. The sections of the desired length are then cut. A cap 43 is then affixed to both ends by gluing or other means. A low modulus plastic of acrylic or polycarbonate material 44 is then glued to the top and bottom of the tubing 40. A pair of pieces of piezoelectric polymer film 46, each having a tab 48 are affixed to the plastic 44. Electrical leads 50 are then affixed to tab 48. The polymer film 46 and electrical leads 50 are affixed using the same procedure described in FIGS. 1–3. In operation the flexing is done primarily by the convex sidewalls 42. FIG. 5 shows a waterproof covering such as polyurethane 52 on transducer 38.

Figure 7:
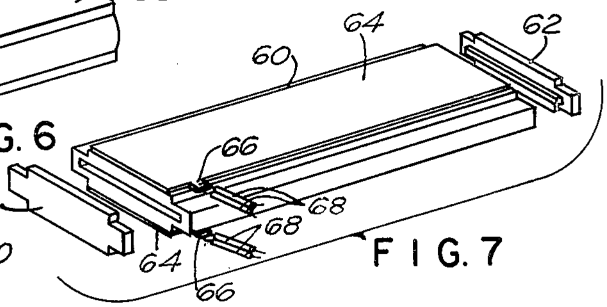
FIGS. 7, 8 and 9 are alternate embodiments of the present invention.

FIG. 7 shows another embodiment in which a section of plastic extruded tube 60 with caps 62 and piezoelectric polymer pieces 64 with tabs 66 to which electrical leads 68 are affixed.

Figure 8:
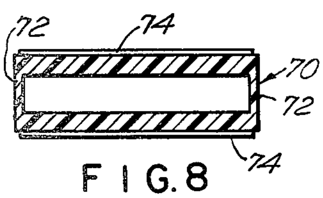
Figure 9:
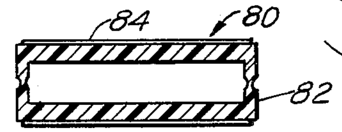

FIGS. 8 and 9 show additional embodiments. In FIG. 8 a plastic extruded tube 70 has flexing sidewalls 72. Piezoelectric polymer pieces 74 are affixed to the top and bottom of tube 70. In FIG. 9 a plastic extruded tube 80 has hinging sidewalls 82 for flexing. Piezoelectric polymer pieces 84 are affixed to the top and bottom of tube 80. Obviously in FIGS. 8 and 9 caps, tabs and electrical leads would be attached in a similar manner to that previously shown. For waterproofing a polyurethane coating would be added.

There have, therefore, been described piezoelectric polymer rectangular flexural plate hydrophones that are shock resistant, reliable, lightweight, neutrally buoyant, thin and relatively inexpensive. These hydrophones are of higher sensitivity than flexural disc hydrophones for the same depth and capacitance requirements, due to more effective coupling of available strain energy and piezoelectric response.

It will be understood that various changes in the details, materials, steps and arrangements of parts, which have been herein described and illustrated in order to explain the nature of the invention, may be made by those skilled in the art within the principle and scope of the invention as expressed in the appended claims.

What is claimed is:

1. A transducer comprising:

a tube having flattened top and bottom surfaces;

a pair of caps with each of said caps connected to respective ends of said tube;

a pair of flexural rectangular plates with one of said plates connected to said top surface of said tube and the other of said plates connected to said bottom surface of said tube;

a pair of rectangular polarized polymer pieces with the most active direction of the polymer transverse to the longitudinal axis of each of said polymer pieces, said polymer pieces each having positive and negative surfaces with respect to each other, the negative surfaces of each of said polymer pieces affixed to respective members of said pair of flexural rectangular plates; and electrical conductors connected to each of said polymer pieces.

2. A transducer comprising:

an extruded housing having a cavity formed by top and bottom walls connected by sidewalls, said top and bottom walls include a hinging structure located at the outer perimeter of said top and bottom walls;

a pair of caps with each of said caps connected to respective ends of said housing to enclose said cavity;

a pair of rectangular polarized polymer pieces with the most active direction of the polymer transverse to the longitudinal axis of each of said polymer pieces, said polymer pieces each having positive and negative surfaces with respect to each other, the negative surfaces of each of said polymer pieces affixed to said top and bottom walls respectively; and electrical conductors connected to each of said polymer pieces.

* * * * *